United States Patent
Hung et al.

(10) Patent No.: US 8,460,979 B2
(45) Date of Patent: Jun. 11, 2013

(54) METHOD OF FABRICATING A BACKSIDE ILLUMINATED IMAGE SENSOR

(75) Inventors: Jhy-Ming Hung, Dacun Township (TW); Jen-Cheng Liu, Hsinchu (TW); Dun-Nian Yaung, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 18 days.

(21) Appl. No.: 12/762,442

(22) Filed: Apr. 19, 2010

(65) Prior Publication Data

US 2010/0273289 A1 Oct. 28, 2010

Related U.S. Application Data

(60) Provisional application No. 61/172,988, filed on Apr. 27, 2009.

(51) Int. Cl.
*H01L 21/84* (2006.01)
*H01L 21/30* (2006.01)
*H01L 21/46* (2006.01)

(52) U.S. Cl.
USPC .... 438/149; 438/455; 438/458; 257/E21.413; 257/E21.566

(58) Field of Classification Search
USPC ............ 438/149, 455, 458; 257/E21.413, 257/E21.566
See application file for complete search history.

(56) References Cited

U.S. PATENT DOCUMENTS

| | | | | |
|---|---|---|---|---|
| 4,053,804 A * | 10/1977 | Aboelfotoh | ............ | 313/587 |
| 5,525,813 A * | 6/1996 | Miyake et al. | ............ | 257/59 |
| 5,940,685 A * | 8/1999 | Loomis et al. | ............ | 438/60 |
| 6,339,010 B2 * | 1/2002 | Sameshima | ............ | 438/458 |
| 6,423,614 B1 * | 7/2002 | Doyle | ............ | 438/458 |
| 6,682,963 B2 * | 1/2004 | Ishikawa | ............ | 438/149 |
| 6,724,037 B2 * | 4/2004 | Yamazaki et al. | ............ | 257/316 |
| 6,814,832 B2 * | 11/2004 | Utsunomiya | ............ | 156/230 |
| 7,534,668 B2 * | 5/2009 | Houston | ............ | 438/164 |
| 7,820,529 B2 * | 10/2010 | Tsurume et al. | ............ | 438/464 |
| 8,076,170 B2 * | 12/2011 | Brady | ............ | 438/57 |
| 2008/0001179 A1 * | 1/2008 | Roy | ............ | 257/228 |
| 2010/0013039 A1 * | 1/2010 | Qian et al. | ............ | 257/432 |
| 2010/0164035 A1 * | 7/2010 | Kim | ............ | 257/432 |
| 2010/0327390 A1 * | 12/2010 | McCarten et al. | ............ | 257/447 |
| 2011/0212609 A1 * | 9/2011 | Okuda et al. | ............ | 438/514 |

* cited by examiner

*Primary Examiner* — Charles Garber
*Assistant Examiner* — Ron Pompey
(74) *Attorney, Agent, or Firm* — Lowe Hauptman Ham & Berner, LLP

(57) ABSTRACT

A method of forming a backside illuminated image sensor using an SOI substrate including a handle substrate, an insulator formed on the handle substrate, and a semiconductor layer formed on the insulator. A sensor element is formed on the semiconductor layer, a dielectric layer is formed overlying the semiconductor layer and the sensor element; and an interconnection structure is formed in the dielectric layer to electrically connect the sensor element. A carrier substrate is forming the dielectric layer. After flipping, the handle substrate is removed to expose the insulator layer.

18 Claims, 3 Drawing Sheets

METHOD OF FABRICATING A BACKSIDE ILLUMINATED IMAGE SENSOR

CROSS-REFERENCE TO RELATED APPLICATIONS

The present application claims priority of U.S. Provisional Patent Application Ser. No. 61/172,988, filed on Apr. 27, 2009, which is incorporated herein by reference in its entirety.

TECHNICAL FIELD

The present disclosure relates to a method of fabricating image sensors, and particularly to a method of fabricating backside illuminated image sensors.

BACKGROUND

An image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor (CIS). Backside illuminated (BSI) image sensors are used for sensing a volume of exposed light projected towards the backside surface of a substrate. The pixels are located on a front side of the substrate, and the substrate is thin enough so that light projected towards the backside of the substrate can reach the pixels. Backside illuminated sensors provide a high fill factor and reduced destructive interference, as compared to front-side illuminated sensors.

As part of the BSI manufacturing process, CMOS wafers are bonded to silicon or glass carrier substrates. Once this bonding process is completed, the wafer is thinned down to several microns using techniques such as grinding, polishing and/or etching. Problems with the backside illuminated image sensors are bonding quality and wafer thinned-down process, which have been the critical bottleneck for mass production. Especially, the thinned-down process followed by backside implantation and wet etching processes generate other issues related to silicon surface protection.

Accordingly, there is a need for an improved method of fabricating such to avoid the shortcomings of the conventional process.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

Figure 1:
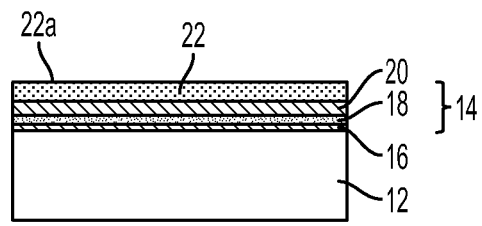
FIG. 1 to FIG. 7 are cross-sectional diagrams illustrating an exemplary embodiment of a method of forming a backside illuminated image sensor.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1 to FIG. 7 illustrate an exemplary embodiment of a method of forming a backside illuminated image sensor.

Referring to FIG. 1, an SOI (silicon-on-insulator) substrate 10 is provided by preparing a handle substrate 12 on which a buried insulator 14 and a semiconductor layer 22 are successively formed. In the exemplary embodiment of this disclosure, the handle substrate 12 is a handle wafer, and the buried insulator 14 includes three insulating layers which may comprise a top first oxide layer 16, an intermediate nitride layer 18, and a bottom oxide layer 20, called an ONO (oxide-nitride-oxide) buried insulator 14. However, any type and/or combination of buried insulating layers may be used for the buried insulator provided such layers have the necessary bonding, interfacing, or etch stop properties. The semiconductor layer 22 may comprise a silicon layer or a silicon wafer. For example, the semiconductor layer 22 may be a p-type silicon layer. In the exemplary embodiment of this disclosure, the semiconductor layer 22 is 0.1~20 μm thick, the bottom oxide layer 16 is 0.1~1 μm thick, the intermediate nitride layer 18 is 0.1~1 μm thick, the top oxide layer 20 is 0.1~1 μm thick, and the handle substrate 12 is 600~800 μm thick. The SOI substrate 10 with the semiconductor layer 22 overlying the buried insulator 14 formed on the handle substrate 12 may be made by any known method, e.g., formed using bonding techniques.

Figure 2:
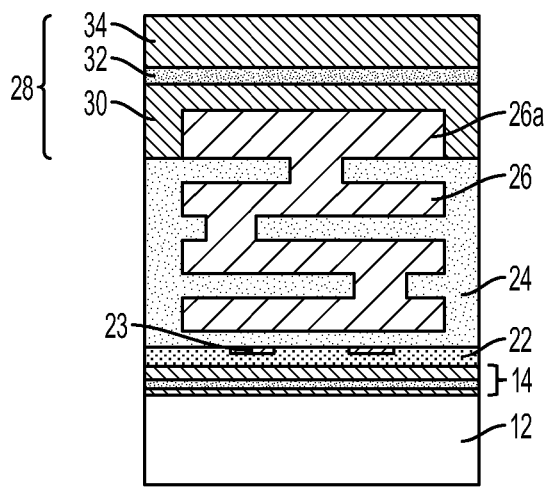

FIG. 2 shows image sensor elements and interconnection structures formed on the semiconductor layer 22. Circuit design is formed on the front surface 22a (active surface) of the semiconductor layer 22. The circuit design includes sensor elements, metal interconnects, metal contacts, metal pads, and other circuitry, and the metal interconnects are formed inside a dielectric layer and/or a passivation layer. The semiconductor layer 22 may further comprise lateral isolation features, such as a shallow trench isolation (STI) structure (not shown) to separate different devices formed on the semiconductor layer 22. It is understood that conventional processes and equipment are used to fabricate the sensor elements, metal interconnects, metal contacts, metal pads, and other circuitry.

One or more sensor elements 23 are formed on the active surface of the semiconductor layer 22. In one embodiment, the sensor elements 23 may be disposed over the active surface and extended into the semiconductor layer 22. The sensor elements 23 each may comprise a light-sensing region (or photo-sensing region) which may be a doped region having n-type and/or p-type dopants formed in the semiconductor layer 22 by a method such as diffusion or ion implantation. The sensor elements 23 may include photodiodes, pinned layer photodiodes, non-pinned layer photodiodes, reset transistors, source follower transistors, transfer transistors, select transistors, complimentary metal-oxide-semiconductor (CMOS) image sensors, charged coupling device (CCD) sensors, active pixel sensors, passive pixel sensors, other sensors diffused or otherwise formed in the semiconductor layer 22, other active and/or passive features configured and coupled to provide proper functions such as imaging and/or sensing, and/or combinations thereof. As such, the sensor elements 23 may comprise conventional and/or future-developed image sensing devices. The sensor elements 23 may comprise a plurality of pixels disposed in a sensor array or other proper configuration. The plurality of sensor pixels may be designed having various sensor types. For example, one group of sensor pixels may be CMOS image sensors and another group of sensor pixels may be passive sensors. Moreover, the sensor elements 23 may comprise color image sensors and/or monochromatic image sensors. Additional circuitry and input/outputs are typically provided adjacent to the sensor elements 23 for providing an operation environment for the sensor elements 23 and for supporting external communications with the sensor elements 23. For example, the sensor elements 23 may further comprise or be coupled to components such as an electric circuit so that the sensor elements 23 are operable to provide a proper response to illuminated light. In some embodiments, each of the sensor elements 23 may be configured to correspond with specific light wavelengths, such as a sensor element for sensing a red light wavelength, a sensor element for sensing a green light wavelength, and a sensor element for sensing a blue light wavelength.

Multi-layer interconnection structure 26 including the metal interconnects, metal contacts and other circuitry are provided inside a plurality of inter-layer dielectric layers 24 formed on the semiconductor layer 22. The interconnection structure 26 is coupled to the sensor elements 23 and other electric units formed in the semiconductor layer 22. The interconnection structure 26 includes various metal features, and contact features configured between metal layers and the semiconductor layer 22. The interconnection structure 26 further includes vias each configured between adjacent metal layers, coupling adjacent metal layers to one another. In the exemplary embodiment of this disclosure, the interconnection structure 26 includes copper. The interconnection structure 26 may alternatively or collectively include other conductive materials such as copper alloy, titanium, titanium nitride, tantalum, tantalum nitride, tungsten, polysilicon, metal silicide, or combinations thereof. The metal silicide may include nickel silicide, cobalt silicide, tungsten silicide, tantalum silicide, titanium silicide, platinum silicide, erbium silicide, palladium silicide, or combinations thereof. The interconnection structure 26 may include multiple-layer structures, such as a barrier layer, a copper seed layer, and bulk copper. In one example, the top metal layer includes aluminum and the rest of the metal layers include copper. The interconnection structure 26 may be formed by a technique such as chemical vapor deposition, physical vapor deposition (PVD or sputtering), plating, other suitable processes, or combinations thereof. For example, PVD may be used to form a copper seed layer, and then a plating process may be employed to deposit bulk copper for interconnection. The metal layers in FIG. 2 are only for example and simplicity. In various embodiments, the interconnection structure 26 may include less or more than three metal layers.

The inter-layer dielectric layer 24 is disposed on the semiconductor layer 22 to isolate the interconnection structure 26. Various etch stop/barrier layers may be interposed between adjacent inter-layer dielectric layers 24 for providing an etch stop function utilized during damascene processes or a barrier function to eliminate moisture diffusion to the interconnection structure 26 and copper migration to the inter-layer dielectric layers 24. The stop/barrier layers may include silicon nitride, silicon oxynitride, or other suitable materials. The inter-layer dielectric layer 24 may include silicon dioxide such as undoped silica glass (USG), silicon nitride, silicon oxynitride, polyimide, spin-on glass (SOG), fluoride-doped silicate glass (FSG), carbon doped silicon oxide such as SiCOH, BLACK DIAMOND® (Applied Materials of Santa Clara, Calif.), XEROGEL®, AEROGEL®, amorphous fluorinated carbon, Parylene, BCB (bis-benzocyclobutenes), SILK® (Dow Chemical, Midland, Mich.), and/or other suitable materials. The inter-layer dielectric layer 24 may be formed by any technique including spin-on, CVD, sputtering, or other suitable processes. For example, plasma enhanced (PE) CVD may be utilized to form silicon oxide from silane ($SiH_4$) or tetraethoxysilane (TEOS). In another example, high density plasma (HDP) CVD may be utilized. The interconnection structure 26 and the inter-layer dielectric layers 24 may be formed in an integrated process referred to as a damascene process, such as a dual damascene process or a single damascene process.

Referring to FIG. 2, a passivation layer 28 is provided on the inter-layer dielectric layer 24 to substantially cover the devices and seal the device from moisture and other contamination. The passivation layer 28 includes silicon oxide, silicon nitride, or the combinations thereof. Another passivation layers may be provided for enhanced passivation and adhesion. In the exemplary embodiment of this disclosure, the passivation layer 28 comprises a first silicon oxide layer 30, a second silicon nitride layer 32, and a third silicon oxide layer 34 successively deposited on the inter-layer dielectric layer 24, in which the top metal layer 26a of the interconnection structure 26 is provided inside the third silicon oxide layer 34.

Figure 3:
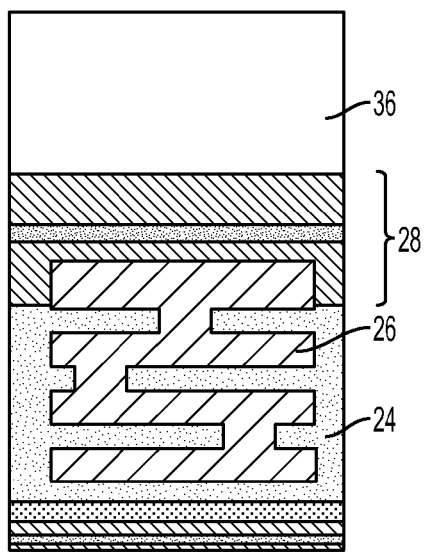
Figure 4:
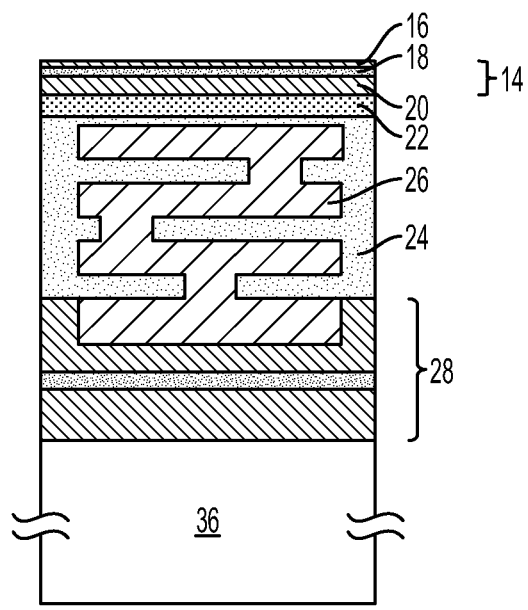

FIG. 3 shows a carrier substrate 36 bonded to the passivation layer 28. The carrier substrate 36 may be coated by an adhesive layer, depending on the bonding method used. The carrier substrate 36 may provide protection for the various features formed on the semiconductor layer 22. The carrier substrate 36 may also provide mechanical strength and support for subsequent processes. The carrier substrate 36 may comprise any suitable material, such as silicon wafer and/or glass. In an embodiment, the carrier substrate is $p^+$-type silicon substrate. Referring to FIG. 4, the bonded structure is flipped, and then the handle substrate 12 is removed e.g., by grinding and/or etching to re-expose the bottom oxide layer 16. This can make the device thin enough to allow the radiation incident on the backside of the semiconductor layer 22 to reach the sensor elements.

Figure 5:
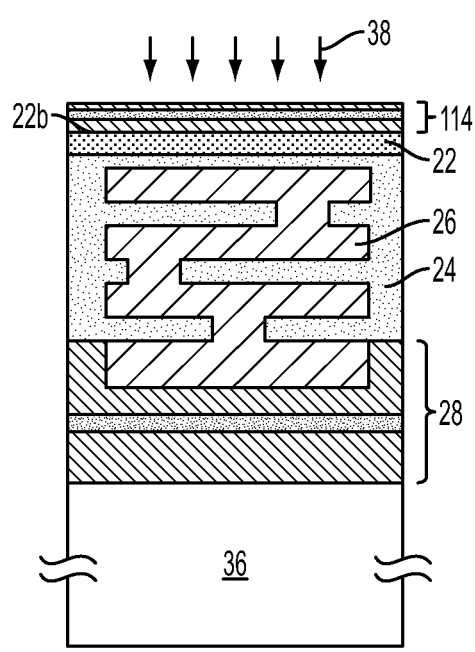
Figure 6:
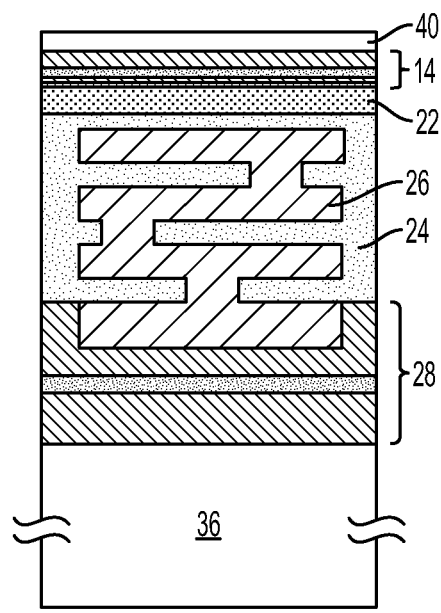
Figure 7:
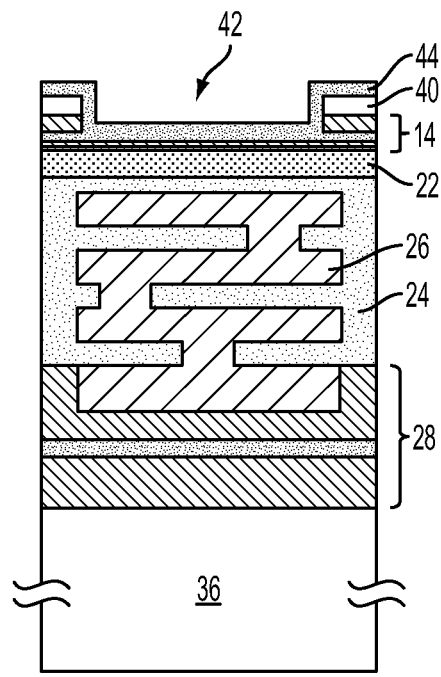

FIG. 5 shows a p-type implantation 38 performed on the backside 22b of semiconductor layer 22. The P-type implantation 38 prevents electrons from gathering at backside surface. Then, referring to FIG. 6 and FIG. 7, processing of the backside of the semiconductor layer 22 is performed. Using the ONO buried layer 14 as a buffer layer, a conductive layer 40 is deposited on the exposed bottom oxide layer 16. The conductive layer 40 is a metal layer comprising copper, aluminum, or combinations thereof. Next, photolithography and etch techniques are used to pattern the conductive layer 40 to form an opening 42 in the conductive layer 40, which may extend into at least a part of the ONO buffer layer 14. In an embodiment of this disclosure, the opening 42 passes through the conductive layer 40 and the bottom oxide layer 16 to expose the intermediate nitride layer 18. A dielectric layer 44, e.g. a silicon nitride layer is deposited on the exposed surfaces of the opening 42 and the conductive layer 40.

In some embodiments of this disclosure, an SOI substrate with an ONO buried insulator is used for backside illuminated image sensor manufacture, in which the ONO buried insulator serves as a buffer layer for the backside processes including implantation, metal deposition and etching process. This can provide a silicon surface protection to reduce crystal defects from implantation process and/or etching process, and suppress generation of white-pixel and/or dark-current. Also, the manufacturing method using the SOI substrate with an ONO buried insulator can simplify the integration process to reduce costs, which can easily extend to all generation processes.

Although the present disclosure has described preferred embodiments, it is not intended to limit the disclosure to the precise embodiments disclosed herein. Those skilled in this technology can still make various alterations and modifications without departing from the scope and spirit of this disclosure.

What is claimed is:

1. A method of forming a backside illuminated image sensor, comprising:
   providing a first substrate comprising a handle substrate, an insulator formed on the handle substrate, and a semiconductor layer formed on the insulator, wherein the insulator comprises a first oxide layer having a thickness between 0.1 µm and 1 µm formed on the handle substrate, a nitride layer formed on the first oxide layer, and a second oxide layer formed on the nitride layer;
   forming a sensor element on the semiconductor layer;
   forming a dielectric layer overlying the semiconductor layer, covering the sensor element;
   forming an interconnection structure in the dielectric layer, electrically connected to the sensor element;
   forming a passivation layer on the dielectric layer;
   bonding a second substrate to the passivation layer; and
   removing the handle substrate, exposing the first oxide layer
   forming a conductive layer on the exposed first oxide layer
   forming an opening through the conductive layer; and
   forming a second dielectric layer on a surface exposed by the opening.

2. The method of claim 1, wherein the nitride layer is between 0.1 µm and 1 µm thick.

3. The method of claim 1, wherein the second oxide layer is between 0.1 µm and 1 µm thick.

4. The method of claim 1, wherein the semiconductor layer is a silicon layer between 0.1 µm and 20 µm thick.

5. The method of claim 1, further comprising:
   performing an implantation process after removing the handle substrate.

6. The method of claim 5, wherein the implantation process comprises a p-type ion implantation.

7. The method of claim 1, wherein the conductive layer comprises copper.

8. The method of claim 1, wherein the conductive layer comprises aluminum.

9. The method of claim 1, wherein the second dielectric layer comprises silicon nitride.

10. The method of claim 1, wherein the second substrate is a p-type silicon substrate.

11. The method of claim 1, wherein the interconnection structure comprises copper.

12. The method of claim 1, wherein the passivation layer comprises at least one of a silicon oxide layer and a silicon nitride layer.

13. A method of forming a backside illuminated image sensor, comprising:
   providing a first substrate comprising a handle substrate, an insulator formed on the handle substrate, wherein the insulator comprises a first oxide layer having a thickness between 0.1 µm and 1 µm formed on the handle substrate, a nitride layer formed on the first oxide layer, and a second oxide layer formed on the nitride layer; and a semiconductor layer formed on the insulator;
   forming a sensor element on the semiconductor layer;
   forming a first dielectric layer overlying the semiconductor layer and the sensor element;
   forming an interconnection structure in the first dielectric layer, electrically connected to the sensor element;
   forming a second substrate overlying the first dielectric layer; and
   removing the handle substrate, exposing the insulator layer
   forming a conductive layer on the exposed insulator layer
   forming an opening through the conductive layer; and
   forming a second dielectric layer on a surface exposed by the opening.

14. The method of claim 13, wherein the nitride layer is between 0.1 µm and 1 µm thick, and the second oxide layer is between 0.1 µm and 1 µm thick.

15. The method of claim 13, further comprising:
   performing an implantation process through the insulator layer after removing the handle substrate.

16. The method of claim 15, wherein the implantation process comprises a p-type ion implantation.

17. The method of claim 15, wherein the conductive layer comprises copper or aluminum.

18. The method of claim 1, wherein forming the sensor includes forming a sensor which is sensitive to either red wavelengths, green wavelengths, or blue wavelengths.

* * * * *